US010002658B1

(12) United States Patent
Hokenmaier et al.

(10) Patent No.: US 10,002,658 B1
(45) Date of Patent: Jun. 19, 2018

(54) DYNAMIC RANDOM-ACCESS MEMORY WITH EMBEDDED ARTIFICIAL NEURAL NETWORK FUNCTIONALITY

(71) Applicant: Green Mountain Semiconductor Inc., Burlington, VT (US)

(72) Inventors: Wolfgang Hokenmaier, Burlington, VT (US); Ryan A. Jurasek, Burlington, VT (US); Donald W. Labrecque, Colchester, VT (US)

(73) Assignee: Green Mountain Semiconductor Inc., Burlington, VT (US)

( * ) Notice: Subject to any disclaimer, the term of this patent is extended or adjusted under 35 U.S.C. 154(b) by 0 days. days.

(21) Appl. No.: 15/342,111

(22) Filed: Nov. 2, 2016

Related U.S. Application Data

(60) Provisional application No. 62/249,675, filed on Nov. 2, 2015.

(51) Int. Cl.
*G11C 11/24* (2006.01)
*G11C 11/4091* (2006.01)
*G11C 11/4094* (2006.01)
*G06N 3/08* (2006.01)
*G06N 3/063* (2006.01)

(52) U.S. Cl.
CPC .......... *G11C 11/4091* (2013.01); *G06N 3/063* (2013.01); *G06N 3/08* (2013.01); *G11C 11/4094* (2013.01)

(58) Field of Classification Search
CPC . G11C 11/4091; G11C 11/4094; G06N 3/063; G06N 3/08
USPC .......................................................... 365/149
See application file for complete search history.

(56) References Cited

U.S. PATENT DOCUMENTS

| 8,976,893 B2 * | 3/2015 | Bai ....................... H03F 1/3247 375/296 |
| 2009/0086071 A1 * | 4/2009 | Kagawa .................... G01J 1/46 348/300 |
| 2014/0133251 A1 * | 5/2014 | Takahashi ................ G11C 7/08 365/189.16 |

* cited by examiner

*Primary Examiner* — Anthan Tran
(74) *Attorney, Agent, or Firm* — Downs Rachlin Martin PLLC (57) ABSTRACT

A highly configurable, extremely dense, high speed and low power artificial neural network is presented. The architecture may utilize DRAM cells for their density and high endurance to store weight and bias values. A number of primary sense amplifiers along with column select lines (CSLs), local data lines (LDLs), and sense circuitry may comprise a single neuron. Since the data in the primary sense amplifiers can be updated with a new row activation, the same hardware can be reused for many different neurons. The result is a large amount of neurons that can be connected by the user. Training can be done in hardware by actively varying weights and monitoring cost. The network can be run and trained at high speed since processing and/or data transfer that needs to be performed can be minimized.

20 Claims, 4 Drawing Sheets

DYNAMIC RANDOM-ACCESS MEMORY WITH EMBEDDED ARTIFICIAL NEURAL NETWORK FUNCTIONALITY

RELATED APPLICATION DATA

This application claims the benefit of priority of U.S. Provisional Patent Application Ser. No. 62/249,675, filed on Nov. 2, 2015, and titled "HIGHLY CONFIGURABLE ARTIFICIAL NEURAL NETWORK ARCHITECTURE," which is incorporated by reference herein in its entirety.

FIELD OF THE INVENTION

The present invention generally relates to the field of neural network systems. In particular, the present invention is directed to dynamic random-access memory with embedded artificial neural network functionality.

BACKGROUND

Figure 1:
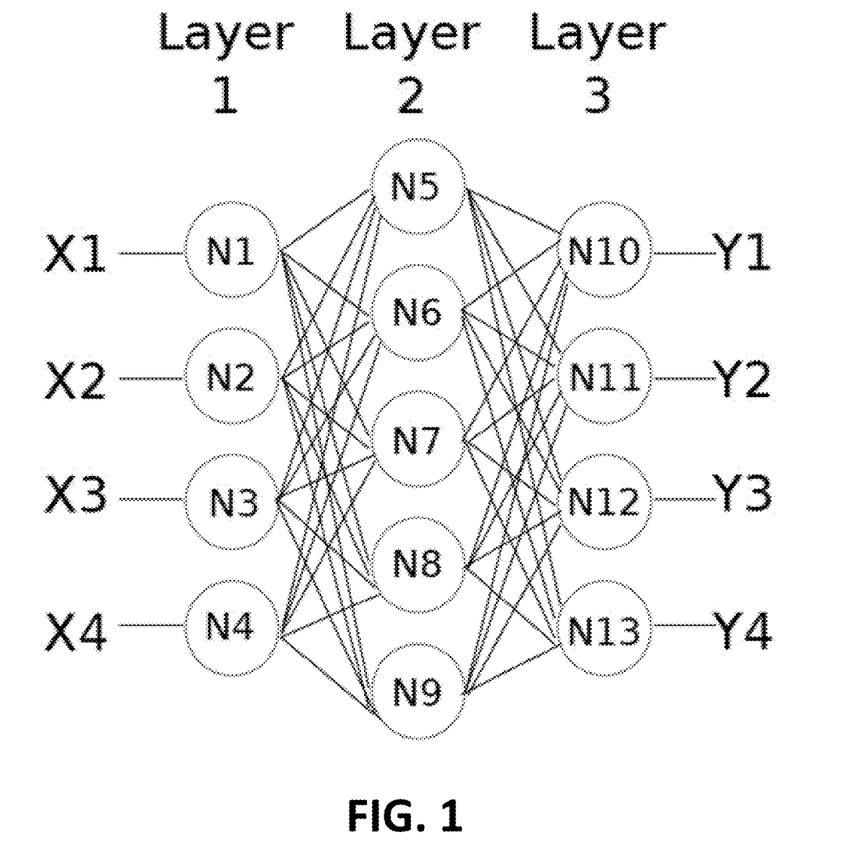
FIG. 1 is a diagrammatic representation of a generic neural network.

For many applications, an artificial neural network (ANN) architecture can be used as a viable alternative to von Neumann style processor architectures. Indeed, ANN architectures are already used in many applications, e.g., for pattern recognition. ANNs typically comprise interconnected sets of nodes that act like and are often referred to as "neurons." An example of an ANN is shown in FIG. 1, wherein the neurons are labeled N1, N2, etc. Each neuron has an output, typically referred to as an "axon," and one or more inputs provided via connections often referred to as "synapses." As shown in FIG. 1, ANNs may have a plurality of layers, often referred to as input layers (e.g., Layer 1), which receive inputs (e.g., X1, X2, etc.), "hidden" layers (e.g., Layer 2), which receive outputs from and provide outputs to other neurons, and output layers (e.g., Layer 3), which produce outputs (e.g., Y1, Y2, etc.). The synapses (indicated as lines between neurons in FIG. 1) typically have weights or coefficients associated therewith to amplify or otherwise modify the signals carried by the synapses and/or received by the neuron. The neuron typically sums the signals of all "upstream" connected synapses (i.e., synapses that provide inputs to the neuron) and any bias applied to the neuron, and through an activation function changes the output axon, which may then be provided via one or more "downstream" synapses to subsequent neurons or as an output of the ANN (for example, in FIG. 1, neuron N1 is "upstream" of neuron N5). The result is a network that can process incoming signals and drive output signals.

Mathematical representations of ANNs have been implemented in software with success and are used in areas such as object detection, voice recognition, and data mining applications, among others. Software-implemented ANNs can be dynamic in that they can be "trained" to solve many different problems. Software implemented ANNs can be more efficient than traditional coding algorithms, but there is still a significant gap in performance relative to an optimal ANN. A common way of implementing a high performance ANN in a semiconductor technology is to train a specific network for a specific task, and then hard-code that solution directly into the semiconductor technology. While this can produce high computing efficiency for a particular implementation, it also results in the loss of the ability to subsequently reconfigure the network by changing weights, biases, or interconnections between neurons or by adding or removing neurons. Other ANNs use memory elements such as SRAM or volatile registers to create an ANN that can be programmed. However, these memory elements are physically large, limit the feasible size of the ANN, and may also limit the flexibility of the connections between neurons.

SUMMARY OF THE DISCLOSURE

In one aspect, the present disclosure provides a platform for an artificial neural network that can be run at high speed with low power requirements. In some embodiments, user configurable neuron connections and/or a user configurable function selection for one or more neurons can be enabled. By using a high density and highly parallel memory architecture, as can typically be found in state of the art dynamic random access memory, the teachings herein provide a framework for implementing very large and highly configurable neural networks. The neural network may be fully contained within the memory device itself, thus eliminating the transfer of data such as weights associated with synapse inputs. In an embodiment, intermediate layers and neuron connectivity information may also be fully integrated into the ANN-enabled memory device, further reducing the chip-external communication to a minimum. The memory device may retain random access write functions sufficient to program a trained neural network into the memory device. The memory device may also retain random access read and write functions in order to train the neural network in situ.

In one implementation, the present disclosure is directed to a dynamic random-access memory with embedded artificial neural network functionality, which includes a plurality of dynamic random-access memory cells associated with a plurality of sense amplifiers; and a plurality of select lines connected to the plurality of sense amplifiers, wherein the sense amplifiers are configured to drive a shared line; and select line activation is performed as a function of neural network layer input data.

In another implementation, the present disclosure is directed to a method of controlling a dynamic random-access memory with embedded artificial neural network functionality and a plurality of dynamic random-access memory cells, which includes driving a plurality of select lines connected to a plurality of sense amplifiers, wherein the sense amplifiers are configured to drive a shared line; and performing select line activation as a function of neural network layer input data.

In yet another implementation, the present disclosure is directed to a machine-readable storage medium containing machine-executable instructions for performing a method of controlling a dynamic random-access memory with embedded artificial neural network functionality and a plurality of dynamic random-access memory cells. The machine-executable instructions include a first set of machine-executable instructions for driving a plurality of select lines connected to a plurality of sense amplifiers, wherein the sense amplifiers are configured to drive a shared line; and a second set of machine-executable instructions for performing select line activation as a function of neural network layer input data.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Aspects of the present disclosure provide solutions that increase the flexibility of artificial neural network (ANN) development while still allowing a high number of neurons to be used. In particular, embodiments herein are directed to dynamic random-access memory (DRAM) with embedded ANN functionality. Aspects of the present disclosure can be used to implement standalone, embedded, or complementary systems, among others, that can quickly and easily implement ANN solutions. Although aspects of the present disclosure are directed to DRAM with embedded ANN functionality, practical uses of the inventive subject matter disclosed herein can extend far beyond DRAM integrated circuits. For example, a central processing unit, video processing unit, or other computing device may be developed or modified to take advantage of the teachings disclosed herein. Further, self-driving vehicles, manually or semi-automatedly controlled vehicles, power generation or distribution systems, security systems, and/or a vast array of other large, complex systems may take advantage of the teachings provided herein, as will be appreciated by those of ordinary skill in the art after reading this disclosure in its entirety.

In some embodiments, ANNs implemented in accordance with the teachings herein can be used as a basis for a readily reprogrammable computing component in self-driving or semi-automatedly controlled vehicles. For example, at the time of manufacture, a vehicle manufacturer may include computer vision functionality in an automobile, ship, or other vehicle, e.g., to recognize road hazards, undersea hazards, weather hazards, or otherwise to assist a driver or autopilot function with safely and efficiently navigating routes. However, the computer vision configuration may need to be modified at a later date, which may require a recall to be issued and one or more parts to be physically replaced. By utilizing aspects of the present disclosure, many such situations can be avoided, as the solutions provided herein not only enable a very efficient neural network to be developed but also enable that neural network to be updated as appropriate without requiring hardware to be physically replaced, thus not only enabling high-performance neural networks with large memory capacity but also reducing expenses for manufacturers when neural networks need to be updated in existing products.

ANNs use memory in order to hold the value of each of the weights on the synapses as well as biases for the neurons. The weights and biases often need to be updated, because training an ANN is an iterative process. As such, memory used with ANNs should have a high, and preferably infinite, endurance. The memory should also be dense to allow for the high number of weights and biases typically needed for a large ANN. Further, the memory should have a short, fast random access time so that various weights, biases, and axons can be updated and evaluated quickly in order to deliver a high performance ANN. Given these constraints, the present inventors have determined that a modified DRAM memory architecture, which typically utilizes just one transistor and one capacitor per bit, is a viable choice to meet these requirements.

A typical DRAM utilizes both row activates and column accesses. When performing a row activate, a wordline connected to the gate of a cell transfer device is selected and data is transferred from the DRAM capacitor to the bitline, where a latch circuit known as a "sense amplifier" amplifies and holds the data. Typically, this is done for many cells in parallel, as a DRAM has a destructive read and any cell to which the selected wordline connects must then be captured by a sense amplifier or its data will be lost. During a column access a column select line (CSL) is driven to a specific sense amplifier. The data from the sense amplifier is then transferred to a local data line (LDL), which is a shared line, usually through a transfer transistor. The data is then transferred to another data line and eventually may be driven off the chip.

An ANN-enabled DRAM device may hold weights in some of the memory cells instead of using those cells as standard, generic storage locations. Since each memory cell can only store one bit of data, the weight associated with a synapse input is stored in multiple cells, depending on the desired resolution of the weight programming. Further, an ANN-enabled DRAM may allow multiple CSLs to be driven such that multiple sense amplifiers attempt to transfer their data to the same LDL simultaneously. In a state of the art DRAM device, this would lead to a conflict due to the attempt to drive multiple digital signals onto a single data line. For example, any single sense amplifier which stores a "zero" (low voltage) may pull the LDL down to a logical zero level if connected by means of the CSL. The information stored in other sense amplifiers would therefore not further contribute to the final outcome and be lost.

Figure 2:
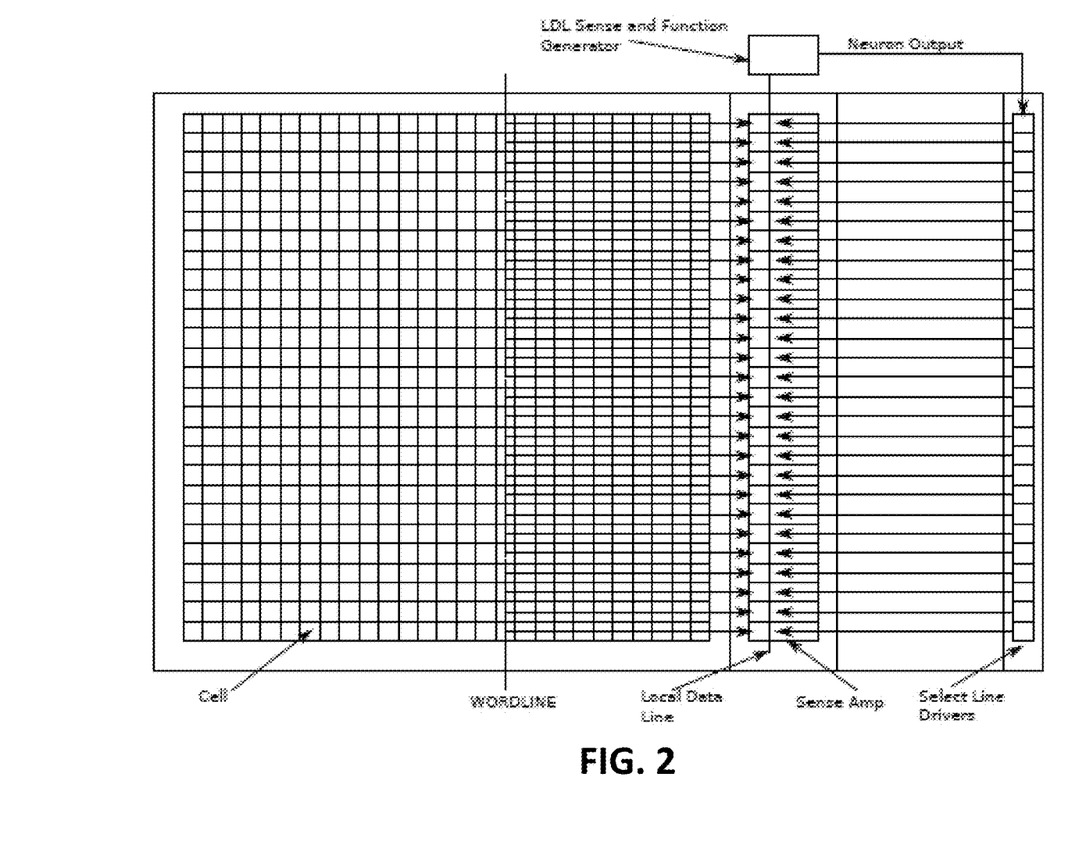
FIG. 2 is a diagram of a dynamic random-access memory with embedded artificial neural network functionality.

In an ANN-enabled DRAM, however, a LDL amplifier, analog-to-digital converter, and/or other component may distinguish between multiple different analog voltage levels on the LDL. Such an amplifier is shown as "LDL sense and function generator" in FIG. 2. In addition, the connection of the sense amplifier to the LDL may differ from the configuration of a standard DRAM device such that each digital signal and associated active CSL contributes to the analog signal on the LDL. For example, if four sense amplifiers are connected to the same LDL by means of four active CSLs, the LDL may carry a current or voltage equivalent to one of the sixteen possible combinations of weight data. The above mentioned data line sense amplifier may identify the signal level and communicate the result in a digital or analog fashion for further processing. The result may be generated by the "function generator" portion of the "LDL sense and function generator" of FIG. 2 and may be based on various activation functions, such as those known and used in the ANN art. For example, a sigmoid activation function can be used to generate the axon output. This activation function may also be programmable within the memory device. For example, a first read command may activate multiple CSLs associated with memory sense amplifiers and memory cells used to store the activation function parameters. The resulting analog value on the LDL may then be stored in the LDL sense and function generator to act as a reference level for the subsequent neuron activations.

In some embodiments, an ANN-enabled DRAM sense amplifier may distinguish between a sufficient number (e.g., more than two or more than four) of analog levels, in which case the sense amplifier itself may be treated as a neuron and its output may be considered the axon, which could carry either a single digital bit (yes/no decision) or a multi-bit digital or analog value. In some embodiments, an ANN-enabled DRAM data line sense amplifier may additionally or alternatively be considered to be part of a neuron, such that its output needs to be further processed with other information gained from other data line sense amplifiers or from the same data line sense amplifier over time through multiple word and/or column select accesses. The combined information may contain a sufficient number of weighted inputs and resolution to decide on the final result, which could be considered the axon.

An ANN may contain a few neurons, several million neurons, or even many billions of neurons. The number of neurons relates to the complexity and number of layers of the ANN. The greater the number of neurons, the more complex the artificial network typically becomes to train, and therefore the longer it usually takes to train the network. It is therefore desirable to have a network that matches the needs of a given problem. One approach to train an ANN is referred to as "gradient descent." To use the gradient descent method to minimize error in outputs produced by an ANN, typically a function is derived for the sum of the error of all outputs given an input stimulus and corresponding expected, known correct outputs. The derived function is typically referred to as the "cost function," and the inputs and expected outputs are commonly referred to as "training data." A partial derivative for each weight is computed in order to perform an optimization on the cost function to minimize errors produced by the ANN. By analyzing the partial differential of the weight, a vector for reducing overall error can be determined. The weight is moved in accordance with that vector, and the training continues with further training data until the error produced by the ANN is at or below an acceptable minimized (and preferably minimum) value. There are many functions, as well as step sizes for initial and incremental weight placement, that can be used to optimize training.

In order for ANNs to become practical with a large amount of neurons, training should be able to be performed relatively quickly. Rather than computing the partial derivatives of each of the weights, in some embodiments, a small error value may be introduced into one or more of the weights by using an increment or decrement function in hardware to move the value of the weights slightly higher or lower. The training data can then be applied to the network in order to determine whether the total cost function has decreased or increased as a result of the change in the one or more weights. The weight may then be updated if necessary (e.g., if the change resulted in a reduction in error, the weight may be assigned the new value as modified by the error value) and the procedure repeated until the network is fully trained or until error is minimized to an acceptable level. In some embodiments, all data can be held within the device during training and the total cost function error can be derived and held on the device as well. This minimizes input/output requests and power requirements and can significantly speed up the training procedure.

In some embodiments, a DRAM array may be used to create an ANN that is not only high speed and dense, but also has a high level of flexibility in how the neurons are interconnected, weighted, and arranged. Weights and biases may be stored digitally in the DRAM array. During a row activation, the values of the weights and biases are transferred to the sense amplifier, just as a traditional DRAM would operate. The weights can be binary encoded and at any resolution (number of bits). Each group of CSLs and encoded weights may represent one weighted synapse. The number of encoded bits per synapse can vary, e.g., to accommodate (1) a high resolution weight with relatively fewer synaptic connections or (2) a lower resolution weight with a relatively higher number of synaptic connections, although in some embodiments, a high resolution weight and a high number of synaptic connections may be used, depending on the specific architecture utilized. The total number of synapses is typically equal to the total number of encoded weights, which are connected via transfer devices to a LDL depending on the inputs to each synapse, represented by the CSL activation. Also connected to the LDL is circuitry that senses the LDL potential and applies a function to drive a line representing the axon. The combination of all the CSLs, the sense amplifiers with weights and bias data, the LDL, and the data line sense circuitry and function generation may comprise one full neuron.

To evaluate a neuron, a pulse with a related signal may be driven along column select signal inputs with the LDL pre-charged high (e.g., when nFET transistors are used; the LDL may be pre-charged low instead of high if pFET transistors are used, as those of ordinary skill in the art will readily appreciate after reading this disclosure in its entirety). One approach to evaluate each encoded weight accurately is to sequentially drive select lines with the same significant bits for respective weights. For example, the first evaluation may comprise driving select lines that are only connected to the least significant bit of the weight. Synapses with their least significant bit weight equal to one will transfer a certain amount of charge onto the LDL that is related to the signal input on the select line. Synapses that have the least significant bit weight equal to zero will not cause a change on the LDL. At the end of the pulse from the select line, the LDL (see, e.g., FIG. 2) will then represent the total summed input signal from all synapses with the least significant figure weight equal to one. The signal on the data line may then be sensed and stored. The procedure may then be repeated for the next least significant bit and so on until all bits from the weights and biases are stored. The total signal on the data line from all the select line pulses can then be derived and processed by activation function circuitry to drive the output of the neuron, taking into account the significance or bit-weight of each of the stored intermediate results.

Another approach as opposed to sequentially pulsing select lines is to vary the voltage or the time of the select line based on the significance, in terms of bit-weight and/or in terms of a static or dynamic priority or importance associated with a particular bit position or group of bit positions, of the bit that it is driving. In this way the bit can be binarily weighted to add more or less charge to the data line based on the significance of the bit. The output of the neuron can then be driven back to the select line drivers and stored (if used as an input to another neuron), as shown for example in FIG. 2, or driven off the device (if used as an output of the network). For example, if the weight of each synapse input is encoded with four bits, then there may be four cells and four CSLs associated with each input. In order to give the appropriate significance (in terms of priority or importance) to each bit, the first CSL connected to the least significant (in terms of bit-weight) bit may be active for 1 ns, whereas the other three CSLs for the second, third, and most significant (in terms of priority or importance) bit may then be active for 2 ns, 4 ns, and 8 ns respectively. Thus the amount of charge that could be potentially transferred by one or more of the four bits may be limited in accordance with the significance (in terms of bit-weight and/or in terms of a static or dynamic priority or importance) of each bit, therefore allowing up to sixteen different levels of charge or more to be transferred per synapse input according to the synapse weight programmed into memory through, e.g., a four-bit weight encoding. One or more of the levels of charge may result in the transfer of no charge, which may cause the binary value "0" to appear to be stored in each of the four bits; in some embodiments, this could be treated as a "don't care" condition, thus enabling ternary computing. For example, this may cause that specific synaptic input to be ignored for this neuron. Following the same example, this can additionally or alternatively be achieved by varying the CSL voltage levels, where the highest order (in terms of bit weight) CSL may carry a voltage resulting in, e.g., 8× more current being transferred than through, e.g., a least significant bit (in terms of bit weight) CSL, with the currents for the second and third order bits being, e.g., 4× and 2× the least-significant bit current, respectively. One or more column select pulses may be active for the same duration that a voltage is applied. In some embodiments, dynamic pulses and/or dynamic durations may be utilized based on predetermined, hardcoded, variable, or random input conditions, among others, which may be received from an internal component or an external component, device, or user, among others.

Hybrid methods, which may involve, e.g.: sensing each bit-weight separately for all inputs, using identical CSL pulses and voltages, and/or adding the significance in the function generator; varying the CSL duration depending on the significance (bit-weight and/or priority) of each bit; and/or varying the CSL voltage depending on the significance (bit-weight and/or priority) of each bit, may be advantageous to achieve a high level of accuracy and speed and an optimal combination of analog and digital processing. In some embodiments, the signal-to-noise ratio may become too low on the LDL if too many synapses are combined with simultaneous sensing of all bit-weights, and so in some embodiments it may be necessary to limit the number of synapses and/or use highly sensitive sensing circuitry (e.g., sensing circuitry with an accuracy of 1% to 10%; however, it is noted that less sensitive circuitry may be used in some embodiments).

The significance (in terms of importance or priority) of each bit-location may be hardcoded into, e.g., the architecture of a memory device if the desired resolution of synapse input weights is known in advance. Additionally or alternatively, these one or more significances can be programmed through volatile or non-volatile configuration registers by means already provided for all major memory interface standards, for example through mode register set commands. In some embodiments, significances may be utilized based on predetermined, hardcoded, variable, or random input conditions, among others, which may be received from an internal component or an external component, device, or user, among others. This permanent or non-permanent choice may thus influence the behavior of the activation function generator and/or one or more CSLs depending on the method or methods used.

Figure 3:
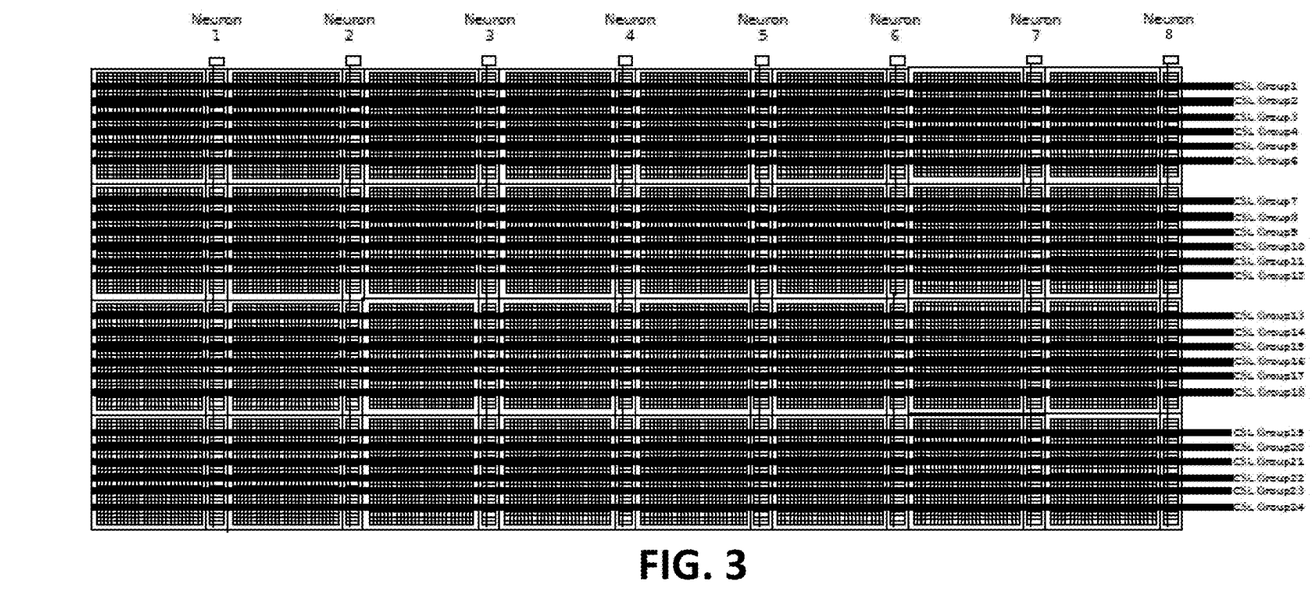
FIG. 3 is a diagram of a dynamic random-access memory with embedded artificial neural network functionality including eight neurons.

In some embodiments, since the DRAM can use activation to repopulate the sense amplifier with new data (here with known weights and biases), it can make use of the same circuitry as another neuron. In order to propagate through many neurons (see, e.g., FIG. 3), many row activations can be performed and the outputs can be stored for use as another select line input. When a new layer in the ANN is desired, the values of the stored outputs of neurons can be driven on select lines of yet again more new weights and biases loaded in the sense amplifiers from another row activation. The order of the row activation, neuron output storage, and update of column select signal data is used to configure the connectivity of the ANN. In ANNs it is often seen that the same driven signal goes to many different synapses of neurons. The neural DRAM hardware introduced herein can take advantage of this by driving several wordlines in an array. The select lines then may be connected to multiple sense amplifiers each and in this way many neurons can get evaluated in parallel, optionally using an algorithm for sequential or parallel evaluations like those discussed hereinabove. Registers can be used to store information indicating the way in which neurons are activated (e.g., loading new data into sense amplifiers) and fed forward (or back) among each other, therefor defining the connectivity of the ANN.

Figure 4:
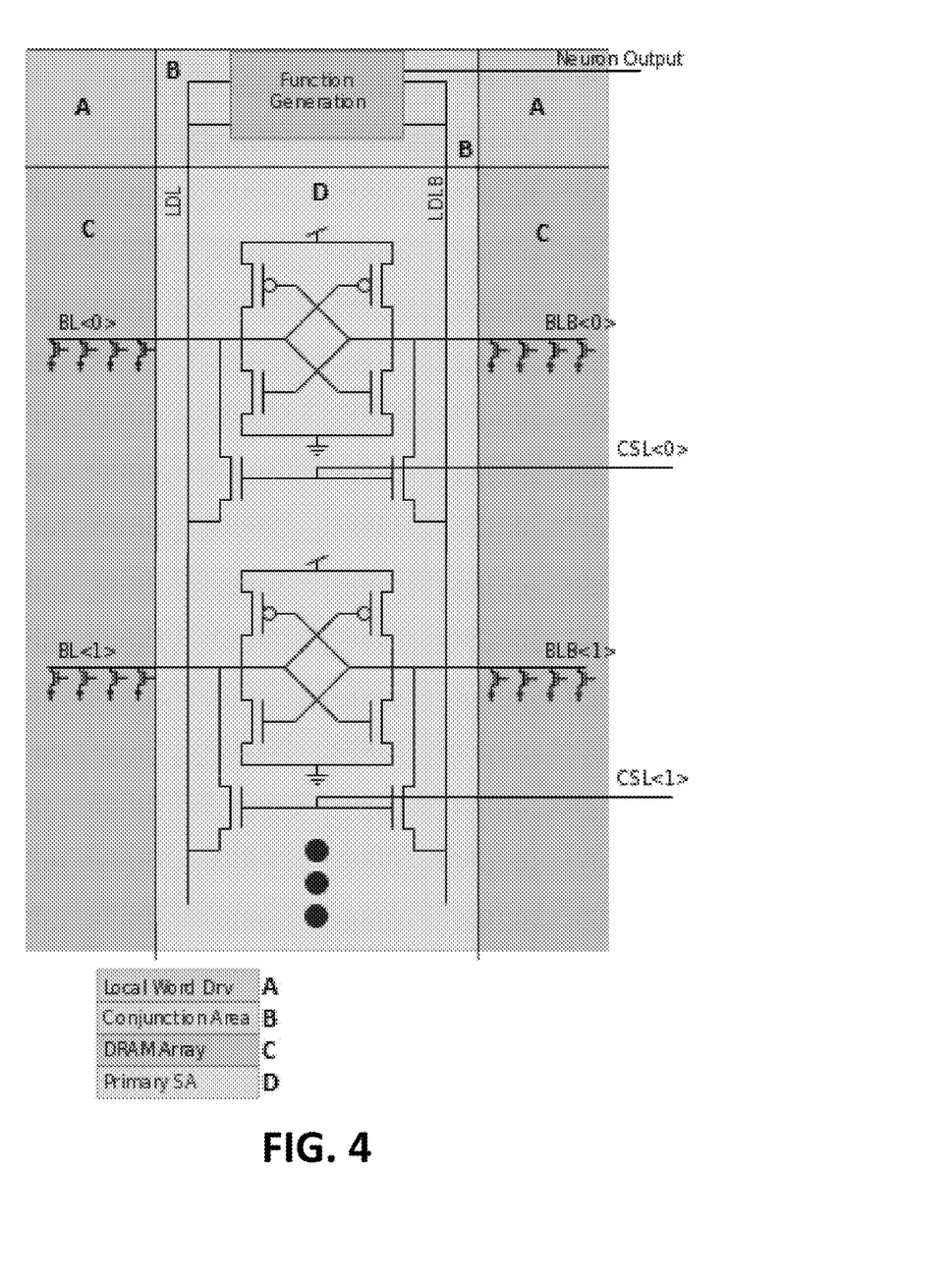
FIG. 4 is a schematic diagram of a sense amplifier and other components that may be used in a dynamic random-access memory with embedded artificial neural network functionality.

By utilizing the architecture and/or teachings described herein, a user can create a custom ANN having from just a few neurons to more than one million neurons and create and/or automatedly discover custom connectivity between these neurons. A minimal set of devices used to implement aspects of the present disclosure may include a DRAM array, a set of sense amplifiers with select lines, a data line to connect the output of the sense amplifiers together, and some circuitry to pre-charge the data line and sense the voltage on the data line (see, e.g., FIG. 4).

The foregoing has been a detailed description of illustrative embodiments of the invention. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A dynamic random-access memory with embedded artificial neural network functionality, comprising:

a plurality of dynamic random-access memory cells associated with a plurality of sense amplifiers; and
a plurality of select lines connected to the plurality of sense amplifiers,
wherein:
the sense amplifiers are configured to drive a shared line;
select line activation is performed as a function of neural network layer input data; and
the select lines are driven sequentially or simultaneously such that a signal on the shared line is modified by at least two sense amplifiers before the shared line is reset or pre-charged.

2. The memory of claim 1, wherein at least one of the select lines is configured to be driven by a signal selectively having a first voltage or a second voltage, wherein the first voltage is utilized for connecting one sense amplifier to the shared line for sensing one single bit per shared line and the second voltage is used for connecting a plurality of sense amplifiers simultaneously to the same shared line such that the shared line carries an analog signal directly dependent on data stored in the plurality of memory cells associated with the connected plurality of sense amplifiers.

3. The memory of claim 1, wherein a voltage of the shared line is sensed and converted to a signal used for a select line input.

4. A dynamic random-access memory with embedded artificial neural network functionality, comprising:
a plurality of dynamic random-access memory cells associated with a plurality of sense amplifiers; and
a plurality of select lines connected to the plurality of sense amplifiers,
wherein:
the sense amplifiers are configured to drive a shared line;
select line activation is performed as a function of neural network layer input data; and
a first select line is driven with a pulse having greater duration or higher voltage than a second select line, the duration or voltage being determined as a function of a bit-weight of an associated memory cell.

5. The memory of claim 4, wherein a voltage of the shared line is sensed and converted to a signal used for a select line input.

6. A dynamic random-access memory with embedded artificial neural network functionality, comprising:
a plurality of dynamic random-access memory cells associated with a plurality of sense amplifiers; and
a plurality of select lines connected to the plurality of sense amplifiers,
wherein:
the sense amplifiers are configured to drive a shared line;
select line activation is performed as a function of neural network layer input data; and
the memory cells store weight information associated with neural network synapses and at least a portion of the weight information is loaded into a sense amplifier prior to evaluation through select lines.

7. The memory of claim 6, wherein the weight information includes a zero-weight indicating that a synapse input is to be ignored for a specific neuron, thus establishing a programmable connectivity of neurons.

8. The memory of claim 6, wherein the select line is driven for a variable amount of time, the amount of time depending on a neural network synapse input signal.

9. The memory of claim 6, wherein the select line is driven with a variable voltage, the variable voltage depending on a neural network synapse input signal.

10. The memory of claim 6, wherein a voltage of the shared line is sensed and converted to a signal used for a select line input.

11. A method of controlling a dynamic random-access memory with embedded artificial neural network functionality and a plurality of dynamic random-access memory cells, comprising:
driving a plurality of select lines connected to a plurality of sense amplifiers, wherein the sense amplifiers are configured to drive a shared line;
performing select line activation as a function of neural network layer input data; and
driving the select lines sequentially or simultaneously such that a signal on the shared line is modified by at least two sense amplifiers before the shared line is reset or pre-charged.

12. The method of claim 11, further comprising driving at least one of the select lines with a signal having a first voltage and subsequently driving the same at least one of the select lines with a signal having a second voltage, wherein the first voltage is utilized for connecting one sense amplifier to the shared line for sensing one single bit per shared line and the second voltage is used for connecting a plurality of sense amplifiers simultaneously to the same shared line such that the shared line carries an analog signal directly dependent on data stored in the plurality of memory cells associated with the connected plurality of sense amplifiers.

13. The method of claim 11, further comprising sensing and converting a voltage of the shared line to a signal used for a select line input.

14. A method of controlling a dynamic random-access memory with embedded artificial neural network functionality and a plurality of dynamic random-access memory cells, comprising:
driving a plurality of select lines connected to a plurality of sense amplifiers, wherein the sense amplifiers are configured to drive a shared line;
performing select line activation as a function of neural network layer input data; and
driving a first select line with a pulse having greater duration or higher voltage than a second select line, the duration or voltage being determined as a function of a bit-weight of an associated memory cell.

15. A method of controlling a dynamic random-access memory with embedded artificial neural network functionality and a plurality of dynamic random-access memory cells, comprising:
driving a plurality of select lines connected to a plurality of sense amplifiers, wherein the sense amplifiers are configured to drive a shared line;
performing select line activation as a function of neural network layer input data; and
storing weight information associated with neural network synapses loading at least a portion of the weight information into a sense amplifier prior to evaluation through select lines.

16. The method of claim 14, further comprising sensing and converting a voltage of the shared line to a signal used for a select line input.

17. The method of claim 15, further comprising driving at least one of the select lines for a variable amount of time, the amount of time depending on a neural network synapse input signal.

18. The method of claim 15, wherein the weight information includes a zero-weight indicating that a synapse input is to be ignored for a specific neuron, thus establishing a programmable connectivity of neurons.

19. The method of claim 15, further comprising driving each of the select lines with a variable voltage, the variable voltage depending on a neural network synapse input signal.

20. The method of claim 15, further comprising sensing and converting a voltage of the shared line to a signal used for a select line input.

* * * * *